United States Patent [19]
Darrow

[11] 4,056,739
[45] Nov. 1, 1977

[54] FAIL-SAFE ELECTRONIC POLARIZED RELAY

[75] Inventor: John O. G. Darrow, Murrysville, Pa.

[73] Assignee: Westinghouse Air Brake Company, Swissvale, Pa.

[21] Appl. No.: 710,554

[22] Filed: Aug. 2, 1976

[51] Int. Cl.² ............................................. H03K 5/18
[52] U.S. Cl. ................................. 307/360; 307/236; 307/363
[58] Field of Search ........... 307/235 R, 235 E, 235 N, 307/235 W, 236; 328/150, 26

[56] References Cited

U.S. PATENT DOCUMENTS 3,041,475  6/1962  Fisher, Jr. ............................. 307/236
3,431,435  3/1969  Bizet .................................... 307/309

Primary Examiner—John Zazworsky
Attorney, Agent, or Firm—J. B. Sotak; R. W. McIntire, Jr.

[57] ABSTRACT

A fail-safe symmetrical solid-state polarized relay circuit having a positive and a negative level detector coupled to a source of periodic input signals. A pair of amplifiers for amplifying the a.c. oscillations produced by the level detectors. A plurality of rectifiers for rectifying the a.c. oscillations and for alternately producing a d.c. output voltage on a pair of output terminals in accordance with the positive and negative excursions of the periodic input signals.

10 Claims, 1 Drawing Figure

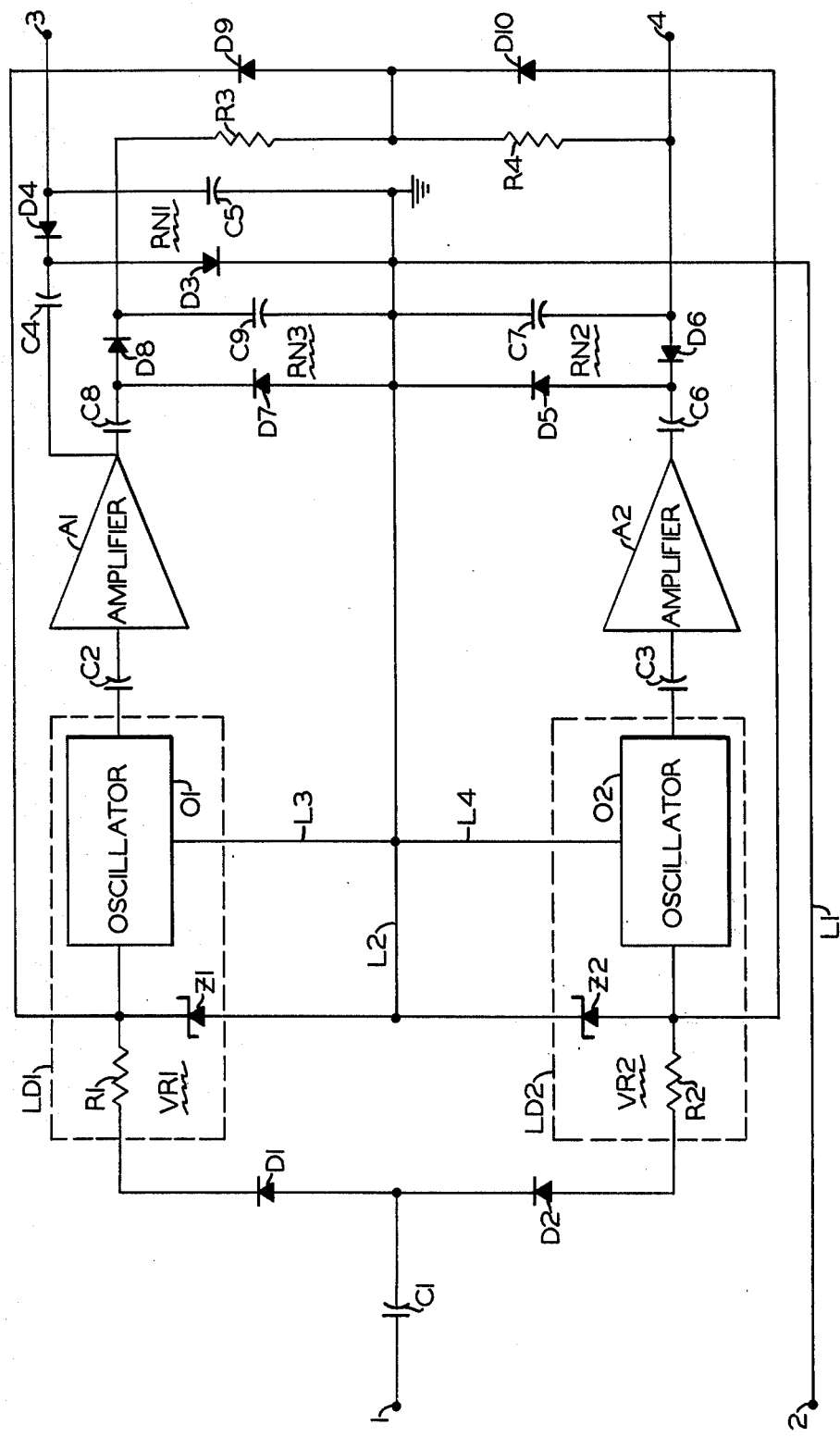

FAIL-SAFE ELECTRONIC POLARIZED RELAY

FIELD OF THE INVENTION

This invention relates to a fail-safe electronic polarized relay and, more particularly, to a solid state relay circuit employing a dual level detecting, amplifying, and rectifying circuit arrangement which operates in a fail-safe manner to produce a d.c. voltage on a first output terminal when an a.c. input signal exceeds a predetermined positive value and to produce a d.c. voltage on a second output terminal when the a.c. input signal exceeds a predetermined negative value.

BACKGROUND OF THE INVENTION

In certain types of signaling and communication systems, such as in vital railroad continuous code cab signaling apparatus, it is mandatory that each subsystem, portion, component, and element must operate in a fail-safe manner in order to ensure the integrity of the overall system. The coded continuous cab signal system may be divided into two basic components or subsystems, namely, the wayside portion and the car-carried portion.

In practice, the wayside portion includes a coded transmitter which couples coded alternating current signals into the running rails. The coded alternating current signals are picked up by inductive receiver coils mounted forward of the front wheels of the engine or locomotive. The picked-up signals, which are made of the carrier frequency and a selected one of a number of code rates, after being amplified and demodulated, are applied to a code following relay termed a master relay. This relay, in turn, drives the code filters, which are selectively responsive to the particular code rate. These filters drive decoding relays to provide a given cab signal indication to the trainman or engineer in the cab of the locomotive. The "master" relay is a fail-safe bipolar magnetic-stick relay designed to be responsive to low-voltage code rates produced by the amplifier section of the carcarried receiver. While the electromagnetic type of "master" relay has operated satisfactorily and admirably in previous cab signal equipment, it is relatively bulky, heavy and expensive, and therefore it would be advantageous and desirable to replace this electromagnetic relay with a smaller, lighter and inexpensive device or element, preferably a fail-safe solid-state circuit. There are certain features which are accomplished by the electro-magnetic master relay which must also be performed by an acceptable electronic relay. Further, an acceptable electronic polarized relay circuit not only must possess the vitality of an electromagnetic master relay but also must provide a sufficient amount of electrical power to drive the code filters of the decoding unit. In addition, the relay circuit must also safely measure the amplitude of picked-up signals for producing an output when and only when the level of the picked-up signals exceeds a predetermined level in order to prevent signals in the adjacent track rails from falsely activating a cab signal indication. Additionally, an electronic master relay must produce an output having an even duty cycle even though the recovered modulation varies in amplitude or has sloped sides.

OBJECTS OF THE INVENTION

Accordingly, it is an object of this invention to provide a new and improved electronic master relay which operates in a fail-safe manner.

Another object of this invention is to provide a fail-safe electronic polarized relay having power amplifying, amplitude-detecting, and zero-crossing switching functions.

A further object of this invention is to provide a unique solid-state relay circuit arrangement employing a dual detecting, amplifying and rectifying circuit for producing an output having an even-duty cycle while functioning in a fail-safe manner.

Yet another object of this invention is to provide a fail-safe solid-state relay circuit for level detecting the positive and negative amplitudes of an input signal and for producing an output when and only when the amplitudes exceed a predetermined value.

Yet a further object of this invention is to provide a vital type of electronic master relay for producing a signal on a first terminal when the positive value of an input signal exceeds a predetermined value and for producing a signal on a second terminal when the negative value of the input signal exceeds a predetermined value.

Still another object of this invention is to provide a novel fail-safe solid-state polarized relay circuit arrangement employing a pair of level detectors, a pair of amplifiers and a pair of rectifiers for alternately producing an output signal on a pair of output terminals when a periodic input signal exceeds a predetermined value.

Still a further object of this invention is to provide a fail-safe electronic polarized relay having a positive level detector and a negative level detector coupled to a source of periodic input signals, a first amplifier coupled to the output of said positive level detector, a second amplifier coupled to the output of said negative level detector, a first rectifier network coupled to the output of said first amplifier for producing a signal on a first output terminal when the periodic input signal exceeds a predetermined positive value, and a second rectifier network coupled to the output of said second amplifier for producing a signal on a second output terminal when the periodic input signal exceeds a predetermined negative value.

An additional object of this invention is to provide a novel fail-safe electronic relay circuit which is economical in cost, simple in design, dependable in service, reliable in use and efficient in operation.

SUMMARY OF THE INVENTION

In accordance with the present invention, there is provided a fail-safe electronic polarized relay circuit including level detecting, amplifying and rectifying circuits. The level detecting is accomplished by a pair of level detectors with each including a voltage regulator and an oscillator. Each regulator includes a Zener diode and a current-limiting resistor coupled through a separate associated diode and a common capacitor to a source of periodic input signals. The output of one oscillator of the pair of level detectors is capacitively coupled to the input of a first amplifying circuit while the other oscillator of the pair of level detectors is capacitively coupled to the input of a second amplifying circuit. The output of the first amplifying circuit is coupled to a first rectifying circuit which includes a pair of diodes and capacitors forming a voltage doubling network. The output of the second amplifying circuit is coupled to a second rectifying circuit which includes a pair of diodes and capacitors forming a voltage doubling network. A third rectifying circuit including a series charging capacitor, a pair of series connected diodes and a capacitor forming a voltage doubling network is coupled to the output of the first amplifying circuit. A dividing circuit including a pair of series connected resistors is coupled between the second and third rectifying circuits. A first diode is coupled from the junction point of the series connected resistors to the input of the one oscillator while a second diode is coupled from the junction point of the series connected resistors to the input of the other oscillator. A first output terminal is coupled to the first rectifying circuit and a second output terminal is coupled to the second rectifying circuit. Accordingly, a d.c. voltage signal is developed on the first output terminal when the positive excursion of the periodic input signal exceeds a predetermined positive value, and a d.c. voltage signal is developed on the second output terminal when the negative excursion of the periodic input signal exceeds a predetermined negative value.

The foregoing objects and other attendant features and advantages of this invention will become more fully evident from the following detailed description when considered in connection with the accompanying drawing wherein:

DESCRIPTION OF THE DRAWING

The sole or single FIGURE is a schematic circuit diagram illustrating a fail-safe electronic polarized relay circuit arrangement in accordance with the present invention.

DETAILED DESCRIPTION OF THE INVENTION

Referring now to the single FIGURE of the drawing, there is shown a vital type of a symmetrical solid-state polarized relay circuit employing a plurality of voltage level detectors, amplifiers and rectifiers. As previously mentioned in a continuous cab signaling operation, the coded signals are picked-up and are demodulated by the car-borne equipment. Thereafter, the demodulated signals are applied to terminals 1 and 2 which form the input of the electronic polarized relay. Input terminal 2 is connected via common lead L1 to a reference potential or ground while the demodulated input signals in the form of periodic alternating current signal appearing on input terminal 1. A common coupling capacitor C1 couples the periodic input signals via diodes D1 and D2 to the pair of voltage level detecting circuits LD1 and LD2, respectively. As shown, the diode D1 is poled to provide the positive alternations of periodic input signals to level detector LD1 while the diode D2 is poled to provide the negative alternations of the periodic input signals to the level detector LD2.

As shown, each of the voltage level detectors LD1 and LD2 includes a voltage regulator and an oscillator. The two level detectors are substantially identical and function in a similar manner with exception that detector LD1 is responsive to the positive excursions of the periodic input signals while detector LD2 is responsive to the negative excursions of the periodic input signals. It will be seen that the voltage regulator VR1 includes a series current-limiting resistor R1 and a shunt breakdown or avalanche device such as, Zener diode Z1. As shown, one end of resistor R1 is connected to the cathode electrode of diode D1 while the other end of resistor R1 is connected to the cathode electrode of Zener diode Z1. The anode electrode of Zener diode Z1 is connected to ground via lead L2. It will be observed that the voltage regulator VR2 includes a series current-limiting resistor R2 and a shunt breakdown or avalanche device, such as, Zener diode Z2. In practice, one end of resistor R2 is connected to the anode electrode of diode D2 while the other end of resistor R2 is connected to the anode electrode of Zener diode Z2. The cathode electrode of Zener diode Z2 is connected to ground potential via lead L2. The oscillators O1 and O2 preferably include a suitable single stage amplifying circuit employing an NPN or PNP transistor as the active element. In fact, the level detectors LD1 and LD2 may be of the type shown and described in my U.S. Pat. No. 3,737,806. As disclosed in the above-noted patent, each of the detectors is a fail-safe circuit employing an A.C. transistorized oscillator and a voltage breakdown device for controlling the amount of degenerative feedback so that sufficient gain for producing a.c. oscillations only occurs when a predetermined level of input voltage causes the breakdown device to conduct and to assume its low dynamic impedance condition. In practice, the level detector LD1 is substantially the same as that shown in the above-mentioned patent while the level detector LD2 has the Zener diode oppositely poled and may utilize a PNP transistor rather than an NPN transistor. As shown, the transistor oscillating circuits O1 and O2 are connected to the ground lead L2 via conductors L3 and L4, respectively. Thus, when the positive alternation of the periodic input signal on terminal 1 reaches a predetermined value, namely, the Zener breakdown level of diode Z1, the oscillator O1 will go into oscillation. Conversely, when the negative alternation of the periodic input signal on terminal 1 exceeds a predetermined value, namely, the Zener breakdown of diode Z2, the transistor oscillator O2 will begin to oscillate and will produce a.c. output signals.

The output of oscillator O1 is coupled to the input of a solid-state amplifier A1 via coupling capacitor C2 while the output of oscillator O2 is coupled to the input of a solid-state amplifier A2 via coupling capacitor C3. The pair of amplifiers A1 and A2 are identical in design and construction so that the amplified a.c. output signals have the same magnitude and characteristics.

As shown, the a.c. output of transistor amplifier A1 is coupled to a first rectifier network RN1 which takes the form of a voltage doubling circuit. The voltage doubling network RN1 includes a series charging capacitor C4, a pair of diode rectifiers D3 and D4 and a shunt voltage doubling capacitor C5. One plate or terminal of capacitor C4 is coupled to the output of amplifier A1 while the other plate or terminal is connected to the junction point formed by the anode electrode of diode D3 and cathode electrode of diode D4. The cathode electrode of diode D3 and one plate of capacitor C5 are connected to ground while the anode electrode of diode D4 and the other plate of capacitor C5 form a first negative d.c. output terminal 3.

As shown, the a.c. output of transistor amplifier A2 is coupled to a second rectifier network RN2 which also takes the form of a voltage doubling circuit. The voltage doubler RN2 includes a series charging capacitor C6, a pair of rectifying diodes D5 and D6, and shunt doubling capacitor C7. It will be seen that one plate of capacitor C6 is connected to the output of amplifier A2 while the other plate of capacitor C6 is connected to the junction point formed by the anode electrode of diode D5 and the cathode electrode of diode D6. The cathode electrode of diode D5 and one plate of capacitor C7 are connected to ground while the anode electrode of diode D6 and the other plate of capacitor C7 form a second negative d.c. output terminal 4.

It will be noted that the a.c. oscillations produced by amplifier A1 are also conveyed to a third voltage doubling rectifier RN3. The voltage rectifying network RN3 includes a series charging capacitor C8, a pair of diode rectifiers D7 and D8 and a shunt doubling capacitor C9. As shown, one plate of capacitor C8 is directly connected to the ouput of amplifier A1 while the other plate is connected to the junction point formed by the anode electrode of diode D8 and cathode electrode of diode D7. The anode electrode of diode D7 and one plate of capacitor C9 are connected to ground via lead L2. The cathode electrode of diode D8 and the other plate of capacitor C9 are connected to a voltage divider formed by series connected resistors R3 and R4. As shown, the upper end of resistor R3 is connected to the junction point formed by the cathode electrode of diode D8 and the other plate of capacitor C9 while the lower end of resistor R4 is connected to output terminal 4. The junction point of series resistors R3 and R4 is connected to the anode electrode of feedback diode D9 and the cathode electrode of feedback diode D10. The cathode electrode of diode D9 is connected to the input of oscillator O1 while the anode electrode of diode D10 is connected to the input of oscillator O2, the purpose of which will be described in detail hereinafter.

Turning now to the operation, it will be assumed that the components or elements of the symmetrical fail-safe electronic polarized relay are interconnected in the manner shown and are intact and functioning properly. Further, let us assume that the decoded or demodulator speed signal picked up by the receiver is applied to input terminals 1 and 2. The input signal of a periodic waveform is coupled to the inputs of voltage level detectors LD1 and LD2 through common capacitor C1 and diodes D1 and D2, respectively. The presence of coupling capacitor C1 allows the d.c. zero level or center line to relocate, and the symmetry of the subsequent circuitry causes the right-handed plate to end to assume a d.c. level which results in an equal excursion of the positive and negative alternations. It will be appreciated that if the amplitudes of the excursions or peak values of the positive and negative alternates are not great enough, namely, greater than the breakdown voltage of Zener diodes Z1 and Z2, no d.c. output voltages will be developed on terminals 3 and 4. However, when the amplitude of the periodic input signal becomes great enough, the positive excursion will cause the Zener diode Z1 to break down and to conduct. The conduction of Zener diode Z1 causes the oscillator O1 to become oscillating so that a.c. signals are supplied to amplifier A1 via coupling capacitor C2. The amplifier a.c. signals are rectified by rectifier RN1 and a negative d.c. voltage is developed on output terminal 3. The a.c. output signals produced by amplifier A1 are also applied to rectifier network RN3 which produces a positive d.c. output voltage. The positive output voltage of rectifier RN3 is designed to be greater than twice the Zener breakdown voltage. Since the output terminal 4 is at zero volts, the potential level at the junction point of voltage divider which includes resistors R3 and R4 is in excess of the Zener breakdown level, current will flow through feedback diode D9 to maintain the Zener diode Z1 conductive. Thus, the oscillator O1 is held in its conductive condition or oscillating state by the feedback or "stick" circuit which supplies holding current to Zener diode Z1.

Now when the periodic input voltage on terminal 1 crosses the a.c. zero line and swings into its negative alternation, a point is reached when the Zener diode Z2 is rendered conductive. With a matched pair of Zener diodes the point of conduction of both the positive and negative excursion is substantially at the same absolute value of voltage. It will be appreciated that the conduction of Zener diode Z2 causes oscillator O2 to go into oscillation whereby a.c. output signals are supplied to amplifier A2. The amplified a.c. signals are rectified by rectifier network RN2 so that a negative d.c. voltage appears on output terminal 4. Since equal and opposite voltages appear on the respective ends of the voltage dividing resistors R3 and R4, the junction point effectively assumes a zero voltage level so that the holding current no longer flows through diode D9. The loss of the holding current causes the oscillator O1 of level detector LD1 to cease oscillating so that the negative d.c. voltage on terminal 3 disappears and so that the rectifier RN3 no longer produces a positive d.c. voltage. Ergo, the negative d.c. voltage at terminal 4 renders diode D10 conductive so that a holding current is supplied to the Zener diode Z2.

Again, when the periodic input signal on terminal 1 swings into the positive excursion and reaches the breakdown voltage level of Zener diode Z1, the oscillator O1 will go into oscillation. The amplified a.c. oscillations are again rectified by network RN1 to develop a negative d.c. voltage on output terminal 3. The rectifier RN3 again produces a positive d.c. voltage at the top of resistor R3 which is equal and opposite to the negative d.c. voltage on terminal 4 so that the holding current through diode D10 ceases to flow. The lack of holding current causes oscillator O2 to quit oscillation and the negative d.c. voltage is removed from output terminal 4. At the same time that the d.c. voltage on terminal 4 disappears, the positive d.c. voltage produced by rectifier RN3 causes a holding current to flow through diode D9 thereby maintaining Zener diode Z1 in its conductive condition.

Thus, it can be seen that a negative d.c. output voltage is alternately produced on terminals 3 and 4 in response to the positive and negative excursions of the periodic input signal appearing across input terminals 1 and 2. The d.c. output voltages will continually appear on terminals 3 and 4 so long as the amplitude of the peak-to-peak input voltage exceeds a predetermined level or value and no critical component or circuit failure is present. As previously mentioned, the output voltage on terminals 3 and 4 is sufficient to drive the respective decoding filters and relays which produce an indication of the appropriate speed that the vehicle may travel in a given track section along its route of travel. It will be appreciated that under no circumstance should a higher or less restrictive speed indication be produced by the cab signal equipment. Thus, the present electronic polarized relay circuit operates in a fail-safe manner in that a critical component or circuit failure is incapable of producing an unsafe condition. It will be appreciated that no failure can cause the outputs on terminals 3 and 4 to switch back and forth at an input level that is lower than the breakdown voltages of Zener diodes Z1 and Z2. It will be seen that if leakage current impairs the centering of the voltage signal coming out of the input capacitor C1, one of the level detectors may turn on sooner but the other level detector will be later. Thus, the first detector will be held or locked on until the input signal is increased.

It will be appreciated that while this invention finds particular utility in cab signaling equipment, it is readily evident that the invention is not merely limited thereto but may be employed in various other apparatus and systems. But regardless of the manner in which the invention is used, it is understood that various alterations may be made by persons skilled in the art without departing from the spirit and scope of the presently described invention. Thus, it will be apparent that modifications and changes can be made to the present invention, and therefore, it is understood that all changes, equivalents and modifications within the spirit and scope of this invention are herein meant to be included in the appended claims.

Having now described the invention, what I claim as new and desire to secure by Letters Patent, is:

1. A fail-safe electronic polarized relay circuit comprising, a positive level detector and a negative level detector said positive and said negative level detectors each includes a regulating and an oscillating circuit, said regulating circuit of said first and said second level detectors coupled to a source of periodic input signals, a first amplifier coupled to the output of said oscillating circuit of said positive level detector, a second amplifier coupled to the output of said oscillating circuit of said negative level detector, a first rectifier network coupled to the output of said first amplifier for producing a signal on a first output terminal when the periodic input signal exceeds a predetermined positive value, and a second rectifier network coupled to the output of said second amplifier for producing a signal on a second output terminal when the periodic input signal exceeds a predetermined negative value.

2. The fail-safe electronic polarized relay circuit, as defined in claim 1, wherein said regulating circuit includes a current-limiting resistor connected to a Zener diode.

3. The fail-safe electronic polarized relay circuit, as defined in claim 1, wherein a common capacitor and a separate one of a pair of diodes couples said regulating circuit of each of said positive and said negative level detectors to the source of periodic input signals.

4. The fail-safe electronic polarized relay circuit, as defined in claim 1, wherein said first rectifier network includes a voltage doubler which provides a d.c. voltage on said first output terminal.

5. The fail-safe electronic polarized relay circuit, as defined in claim 1, wherein said second rectifier network includes a voltage doubler which provides a d.c. voltage on said second output terminal.

6. The fail-safe electronic polarized relay circuit, as defined in claim 3, wherein said voltage doubler includes a pair of capacitors interconnected to a pair of diodes.

7. The fail-safe electronic polarized relay circuit, as defined in claim 4, wherein said voltage doubler includes a series charging capacitor coupled to a pair of series connected diodes which are coupled to a doubler charging capacitor.

8. The fail-safe electronic polarized relay circuit, as defined in claim 1, wherein the output of said first amplifier is coupled to a third rectifier network which provides feedback voltage to said positive level detector.

9. The fail-safe electronic polarized relay circuit, as defined in claim 1, wherein a feedback path is coupled from said second rectifier network to said negative level detector.

10. The fail-safe electronic polarized relay circuit, as defined in claim 1, wherein a third rectifier network is coupled to the output of said first amplifier, a voltage divider including a pair of resistors is coupled between said second and said third rectifier networks, a first diode coupled from the junction point of said pair of voltage dividing resistors to said positive level detector, and a second diode coupled from the junction point of said pair of voltage dividing resistors to said negative level detector.

* * * * *